United States Patent
Peng et al.

(10) Patent No.: US 8,759,163 B2
(45) Date of Patent: Jun. 24, 2014

(54) LAYOUT OF A MOS ARRAY EDGE WITH DENSITY GRADIENT SMOOTHING

(71) Applicant: Taiwan Semiconductor Manufacturing Co., Ltd., Hsin-Chu (TW)

(72) Inventors: Yung-Chow Peng, Hsinchu (TW); Wen-Shen Chou, Zhubei (TW); Jui-Cheng Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/744,532

(22) Filed: Jan. 18, 2013

(65) Prior Publication Data

US 2013/0285190 A1 Oct. 31, 2013

Related U.S. Application Data

(60) Provisional application No. 61/640,073, filed on Apr. 30, 2012.

(51) Int. Cl.
*H01L 21/82* (2006.01)
*H01L 29/00* (2006.01)
*H01L 29/06* (2006.01)

(52) U.S. Cl.
USPC ......... 438/129; 438/128; 438/130; 438/587; 438/982; 257/5; 257/499; 257/506; 257/618; 257/619; 257/626; 257/E27.108

(58) Field of Classification Search
USPC ........ 438/128, 129, 130, 587, 982; 257/5, 72, 257/499, 506, 618, 619, 626, E27.108
See application file for complete search history.

(56) References Cited

U.S. PATENT DOCUMENTS

| | | | |
|---|---|---|---|
| 6,407,434 B1 | 6/2002 | Rostoker et al. | |
| 7,774,726 B2 | 8/2010 | White | |
| 7,962,867 B2* | 6/2011 | White et al. | 716/54 |
| 8,001,516 B2* | 8/2011 | Smith et al. | 716/136 |
| 2003/0040175 A1* | 2/2003 | Deliwala | 438/669 |
| 2005/0044522 A1 | 2/2005 | Maeda | |
| 2005/0058416 A1* | 3/2005 | Hoon Lee et al. | 385/122 |
| 2005/0085932 A1* | 4/2005 | Aghababazadeh et al. | 700/90 |
| 2007/0101305 A1 | 5/2007 | Smith et al. | |
| 2008/0135095 A1* | 6/2008 | Cummings et al. | 136/259 |
| 2008/0213957 A1 | 9/2008 | Balakrishnan | |
| 2009/0193374 A1 | 7/2009 | Fujimoto et al. | |
| 2010/0221846 A1* | 9/2010 | Widdershoven | 436/512 |
| 2011/0047520 A1 | 2/2011 | Chew et al. | |

OTHER PUBLICATIONS

Non-Provisional U.S. Appl. No. 13/727,691, filed Dec. 27, 2012.
Non-Provisional U.S. Appl. No. 13/745,913, filed Jan. 21, 2013.
Office Action Dated May 8, 2014 U.S. Appl. No. 13/727,691.
Office Action Dated Apr. 10, 2014 U.S. Appl. No. 13/745,913.

* cited by examiner

*Primary Examiner* — Thanh V Pham
(74) *Attorney, Agent, or Firm* — Eschweiler & Associates, LLC

(57) ABSTRACT

A multi-step density gradient smoothing layout style is disclosed in which a plurality of unit cells are arranged into an array with a feature density. One or more edges of the array is bordered by a first edge sub-array which has a feature density that is less than the feature density of the array. The first edge sub-array is bordered by second edge sub-array which has a feature density that is less than the feature density of the first edge sub-array, and is approaching that of the background circuitry.

20 Claims, 7 Drawing Sheets

LAYOUT OF A MOS ARRAY EDGE WITH DENSITY GRADIENT SMOOTHING

REFERENCE TO RELATED APPLICATIONS

This application claims priority to U.S. Provisional Patent Application Ser. No. 61/640,073 filed on Apr. 30, 2012, entitled "Layout of a MOS Array Edge with Density Gradient Smoothing", which is hereby incorporated in its entirety.

BACKGROUND

Integrated circuits are often formed in arrays wherein the same Metal-Oxide Semiconductor (MOS) device geometry is repeated multiple times across a reticle field. The performance of the integrated circuit is dependent upon pattern uniformity between the shapes that comprise functional components within the MOS devices within the array in order to ensure matching of their electrical characteristics. Pattern uniformity of the shapes at the edge of the array is sensitive to density of the background circuitry, because there is a density gradient between the edge of the array and the background circuitry. The existing solution is to add a buffer zone of dummy devices which are identical to the MOS device, but not electrically active. The buffer zone results in better pattern uniformity of the active MOS devices within the array, but can add significant area overhead to a chip.

DETAILED DESCRIPTION

Figure 1:
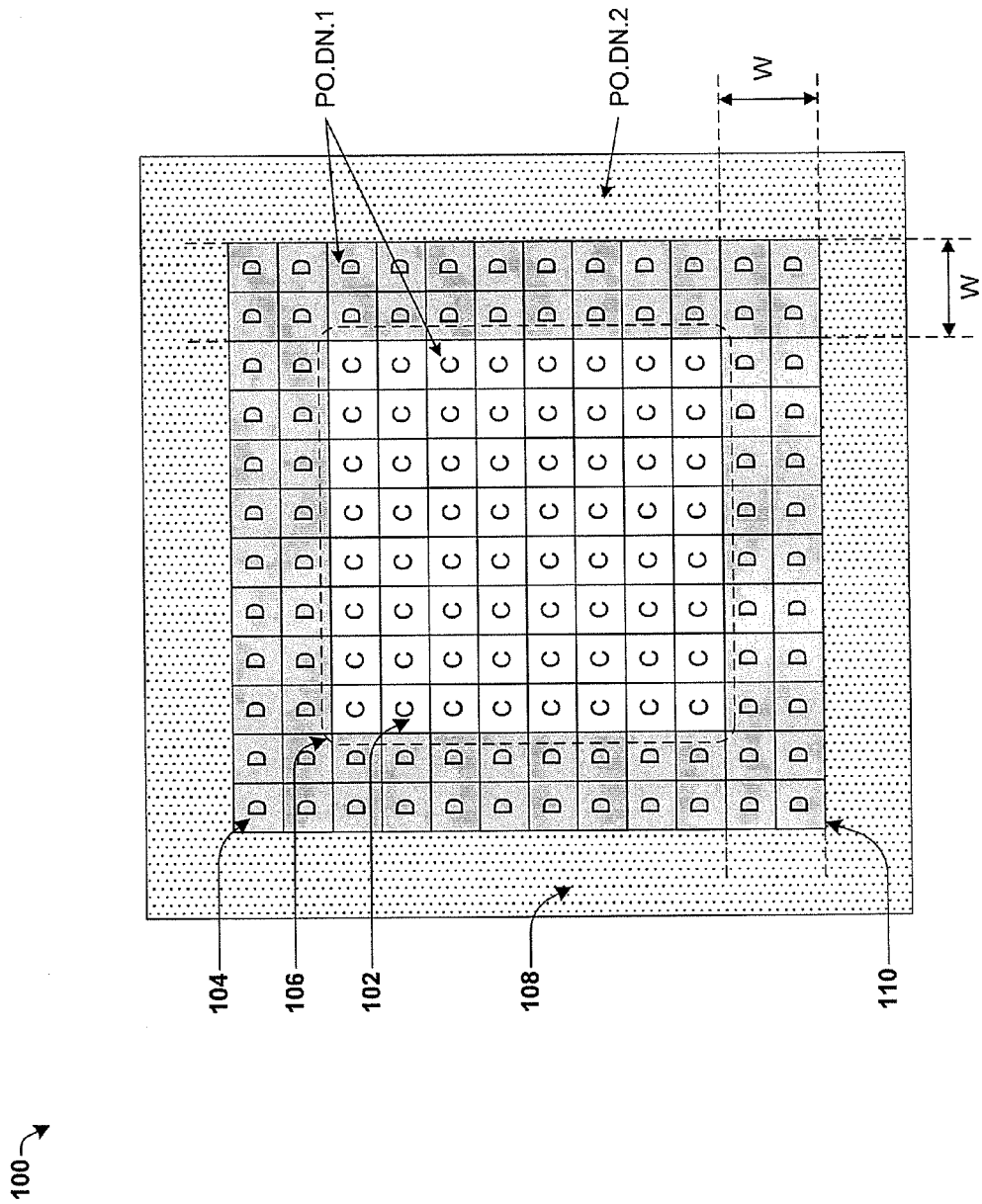
FIG. 1 illustrates some embiments of a semiconductor device array with a buffer zone.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It is evident, however, to one of ordinary skill in the art, that one or more aspects described herein may be practiced with a lesser degree of these specific details. In other instances, known structures and devices are shown in block diagram form to facilitate understanding.

FIG. 1 illustrates some embodiments of a semiconductor device array 100 with a buffer zone, comprising a plurality of unit cells (C) 102 and a plurality of dummy cells (D) 104. A respective unit cell 102 comprises a Metal-Oxide Semiconductor (MOS) device. A respective dummy cell 104 also comprises a Metal-Oxide Semiconductor (MOS) device which is identical to the unit cell 102, except that the dummy cell 104 is not electrically active. The plurality of unit cells 102 are arranged in an array 106 that is surrounded by a buffer zone 110 with a buffer zone width (W). The combined array 106 and buffer zone 110 comprise a first poly density (PO.DN.1), and are surrounded by background circuitry 108 comprising a second poly density (PO.DN.2).

MOS device performance is dependent upon pattern uniformity between the shapes comprising functional components within the plurality of unit cells 102 of the array 106 (e.g., a gate shape comprising a polysilicon gate material, a wire shape comprising one or more metallization planes, etc.) in order to ensure matching of their electrical characteristics (e.g., timing, resistance, current, etc.). From advanced technology nodes such as the 20 nm node (Node-20) or Hi-K Metal Gate (HKMG) manufacturing processes, the poly shape uniformity at the edge of the array 106 is sensitive to density of the background circuitry 108, because there is a poly density gradient between the edge of the array 106 and the background circuitry 108. As a result, the poly shapes within the unit cells 102 of the array 106 are subject to a higher variation on the edge of the array 106 than cells near the center. This variation can be approximately 2~5× higher for a HKMG process than for manufacturing processes such as Metal Inserted Poly-Si (MIPS). The existing solution is to add a buffer zone 110 of dummy cells which are subjected to the increased shape variation, such that the unit cells maintain reduced shape variation and hence better matching of their electrical characteristics. However, the buffer zone width (W) may be up to approximately 20 μm~25 μm, which can add approximately 50%~60% of area overhead to a chip.

Accordingly, the present disclosure relates to a device and method to minimize the area overhead associated with a transition between a semiconductor device array and background circuitry. A multi-step density gradient smoothing layout style is proposed in which a plurality of unit cells are arranged into an array with a feature density (e.g., poly density). The perimeter of the array is surrounded by a plurality of first density gradient cells which form a boundary around the outside of the array, and have a feature density that is less than the feature density of the unit cell. The first density gradient cells are surrounded by a plurality of second density gradient cells which form a boundary around the outside of the first density gradient cells and array. The plurality of second density gradient cells have a feature density that is less than the feature density of the first density gradient cell, and is approaching that of the background circuitry. The multi-step density gradient smoothing layout style results in an edge cell region with a width that is less than that of the existing buffer zone, and can achieve the desired device uniformity, and thus results in less wasted chip area and cost savings.

Figure 2:
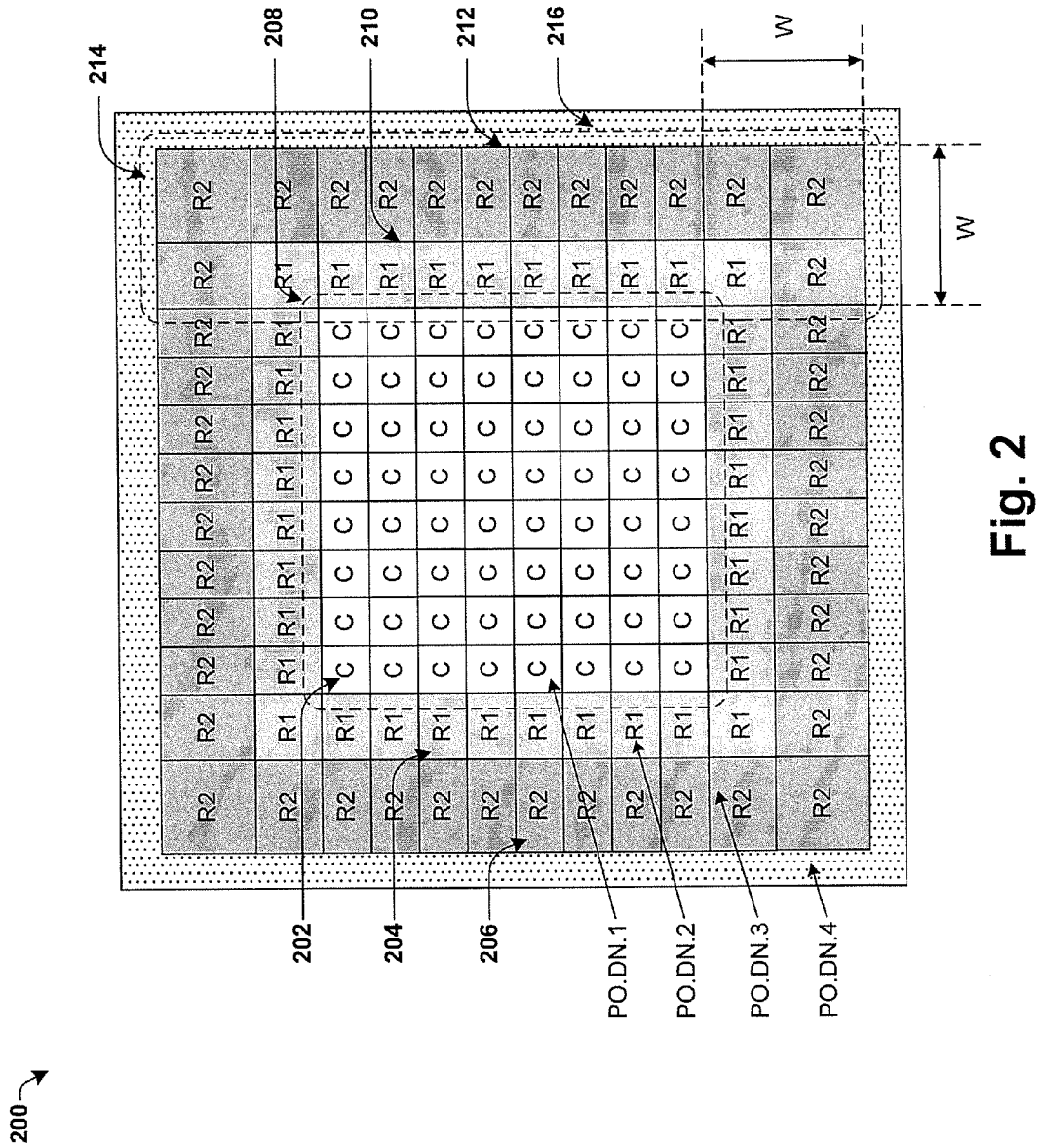
FIG. 2 illustrates some embodiments of a semiconductor device array with multi-step density gradient smoothing edge cells.

FIG. 2 illustrates some embodiments of a semiconductor device array 200 with multi-step density gradient smoothing edge cells, comprising three types of cells: a unit cell (C) 202, a first density gradient cell (R1) 204, and a second density gradient cell (R2) 206, each of which comprises Metal-Oxide Semiconductor (MOS) devices. A plurality of the unit cells 202 are arranged in an array 208. A plurality of the first density gradient cells 204 form a first edge sub-array 210 that surrounds and abuts the array 208. A plurality of the second density gradient cells 206 form a second edge sub-array 212 that surrounds and abuts the first edge sub-array 210. The first edge sub-array 210 and the second edge sub-array 212 combine to form a multi-step density gradient buffer zone 214, comprising an edge cell region width (W), and is surrounded by background circuitry 216.

Unlike the embodiments of a semiconductor device array 100, wherein the unit cell 102 and dummy cell 104 are identical, the embodiments of a semiconductor device array 200 comprises three distinct types of cells: the unit cell (C) 202, the first density gradient cell (R1) 204, and the second density gradient cell (R2) 206, which are not identical, but rather contain different layout topologies formed from the shapes comprising the functional components of the three cells. The array 208 comprises a first poly density (PO.DN.1). The first edge sub-array 210 comprises a second poly density (PO.DN.2) which is less than the first poly density (PO.DN.1). The second edge sub-array 212 comprises a third poly density (PO.DN.3) which is less than the second poly density (PO.DN.2), and approximately the same as a fourth poly density (PO.DN.4) of the background circuitry 216.

In some embodiments, the first edge sub-array is constructed with a feature density that is an average of the feature density of the array and the feature density of the second edge sub-array. In some embodiments, the second edge sub-array is constructed with a feature density that is an average of the feature density of the first edge sub-array and the feature density of the background circuitry. In some embodiments, the first density gradient cell is constructed with a feature density that is an average of the feature density of the unit cell and the feature density of the second density gradient. In some embodiments, the second density gradient cell is constructed with a feature density that is an average of the feature density of the first density gradient cell and the feature density of the background circuitry.

In the non-limiting example of the semiconductor device array 200, area overhead associated with the multi-step density gradient edge cell region is dependent upon the density gradient value between the first poly density (PO.DN.1) and fourth poly density (PO.DN.4). For a density gradient of 30% (i.e., PO.DN.1 is 30% larger than PO.DN.4) the multi-step density gradient edge cell region is approximately 6 μm, which is approximately a 70% savings over the existing buffer zone of 20 μm~25 μm. For a density gradient of 60%, the multi-step density gradient edge cell region is approximately 12 μm, which is approximately a 40% savings over the existing buffer zone of 20 μm~25 μm. The density gradient value between the array 208 and background circuitry 216 is chosen to reduce shape variability of critical circuitry of the array 208 to within a desired manufacturing process specification range. As the density gradient value is reduced, the amount of chip area transitioned from PO.DN.1 to PO.DN.4 is increased, resulting in a penalty in chip area. Increasing the density gradient value reduces the chip area for the transition, but increases shape variability within the array 208. Accordingly, the density gradient value is chosen to meet a combination of these considerations.

Figure 3:
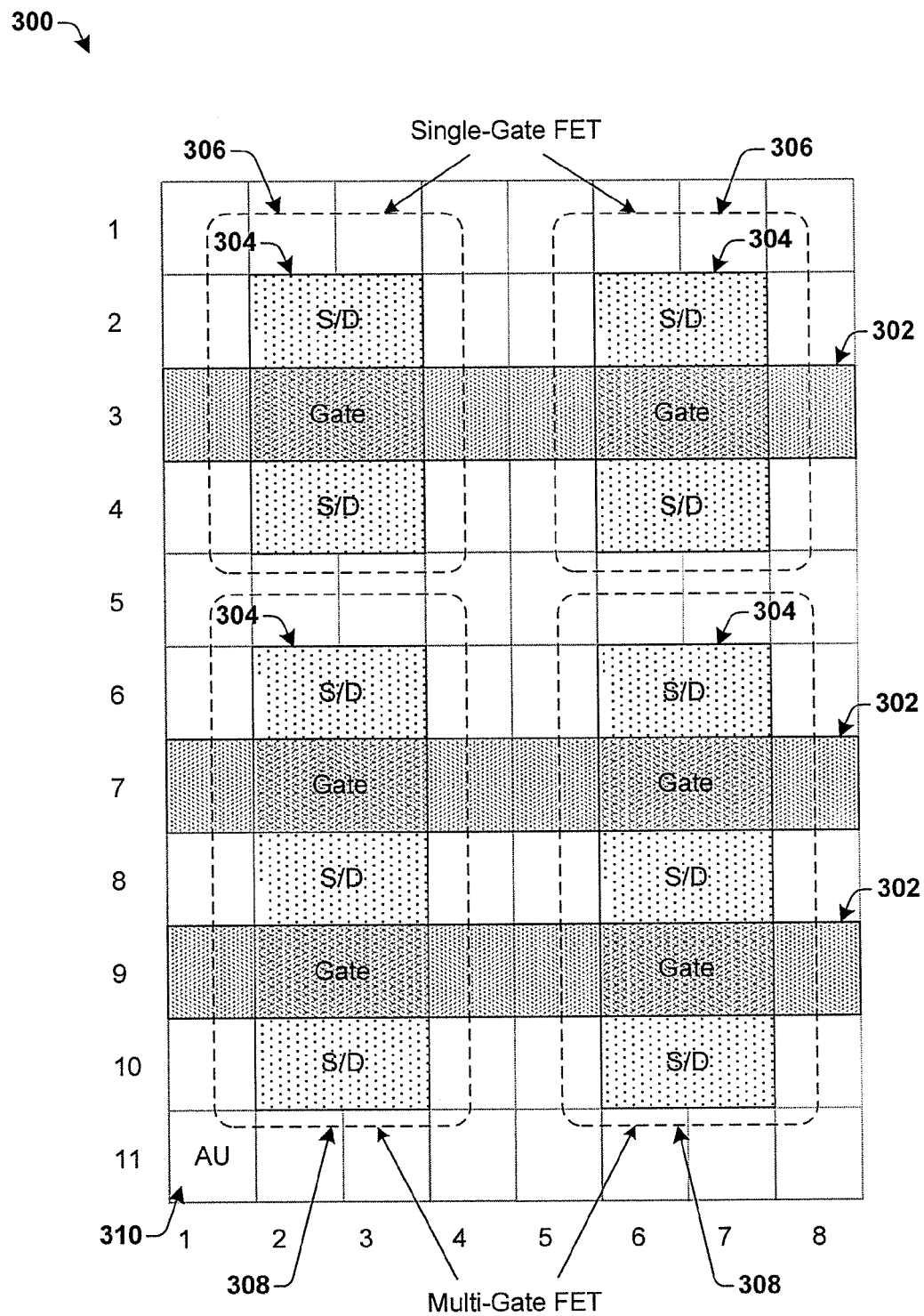
FIG. 3 illustrates some embodiments of transistor layouts for measuring feature densities.

FIG. 3 illustrates some embodiments of transistor layouts 300 for measuring feature densities, comprising three gate materials 302 and four active areas 304, which form two single-gate Field Effect Transistors (FETs) 306 and two multi-gate FETs 308. In the embodiment of FIG. 3, a multi-gate FET 308 comprises two gates. The gate materials 302 and active areas 304 are drawn on a course grid such that each of their two-dimensional areas may be expressed in terms on an area unit (AU) 310. The total layout area for a region of the embodiments of transistor layouts 300 is 8 AU×11 AU=88 AU². The total layout area of the gate materials 302 is 8 AU×1 AU×3=24 AU². The total layout area of the active areas 304 is (2 AU×5 AU×2)+(2 AU×3 AU×2)=32 AU². Therefore, in some embodiments, a feature density is defined for the gate materials 302 as the total layout area of the gate materials 302 divided by the total layout area for the region of the embodiments of transistor layouts 300, which is 24 AU²/88 AU²=27%. Similarly, a feature density is defined for the active areas 304, which is 32 AU²/88 AU²=36%. In some embodiments, a feature density for a shape is defined as the ratio of the total layout area of the shape divided by a total layout area of transistor layouts 300.

A plurality of cells with a same feature density value comprise high pattern uniformity. As the feature density value between the plurality of cells diverges, the pattern uniformity decreases. A large difference between a first feature density value of a first cell and a second feature density value of a second cell demonstrates low pattern uniformity between the first cell and the second cell. A uniform feature density across an array of cells results in minimal variation in between shapes that comprise functional components within the cells. Shape variations between the cells in the array result in a variation of the measured electrical characteristics between the cells (e.g., timing, resistance, current, etc.).

Figure 4A:
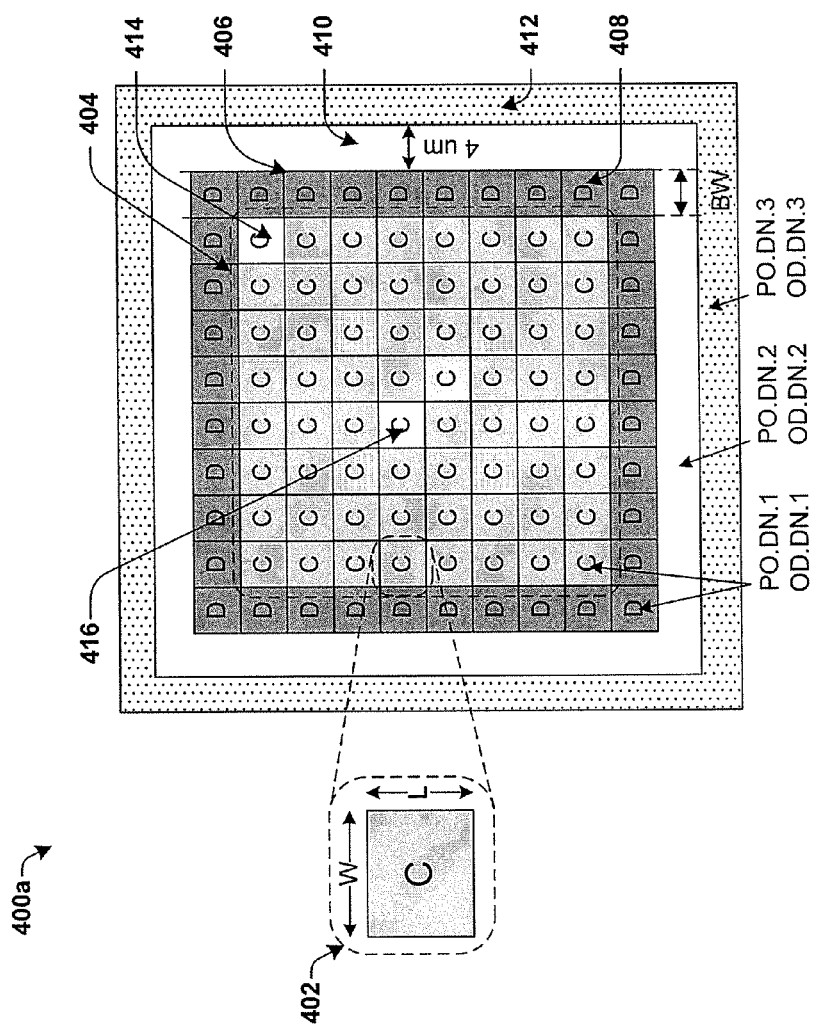
FIG. 4a illustrates some embodiments of a semiconductor device array configured for current measurement.

FIG. 4a illustrates some embodiments of a semiconductor device array 400a configured for current measurement, comprising a plurality of unit cells (C) 402, wherein a respective unit cell 402 has a width (W) of approximately 3 μm, a length (L) of approximately 0.4 μm, and a number of gates=16 (not shown). The plurality of unit cells 402 are arranged in a current unit array 404, and surrounded by a buffer zone formed from a dummy edge sub-array 406. The dummy edge sub-array 406 comprises a ring formed from a plurality of dummy cells (D) 408 disposed around a perimeter of the current unit array 404, wherein a respective dummy cell 408 is identical to a respective unit cell 402, but is not electrically active. The edge sub-array 406 abuts the current unit array 404, and has a buffer zone width (BW). While the dummy edge sub-array 406 of the embodiments of FIG. 4a comprises a single ring of dummy cells 408 (i.e., a single row of dummy cells 408 surrounding the perimeter of the current unit array 404), it will be appreciated that other embodiments comprise multiple rings of dummy cells 408 (i.e., 2 rows, 3 rows, etc.). The semiconductor device array 400a is surrounded by a zone of active circuitry 410, which is surrounded by background circuitry 412.

For the embodiments of the semiconductor device array 400a, the unit cell 402 and the dummy cell 408 (as well as the current unit array 404 and edge sub-array 406) comprise a first poly density (PO.DN.1) of 64% and a first oxide density (OD.DN.1) of 83%. The zone of active circuitry 410 comprises a second poly density (PO.DN.2) of 20% and a second oxide density (OD.DN.2) of 33%. The background circuitry 412 comprises a third poly density (PO.DN.3) of 43% and a third oxide density (OD.DN.3) of 30%. Within an edge cell 414 along an outer edge of the current unit array 404 a current measurement is made, and is compared to a current measurement made within a reference cell 416 near the center of the current unit array 404, to define a cell current value. This process is repeated for a plurality of edge cells along an edge of the current unit array 404 as the buffer zone width (BW) is varied by adding rings of dummy cells 408.

Figure 4B:
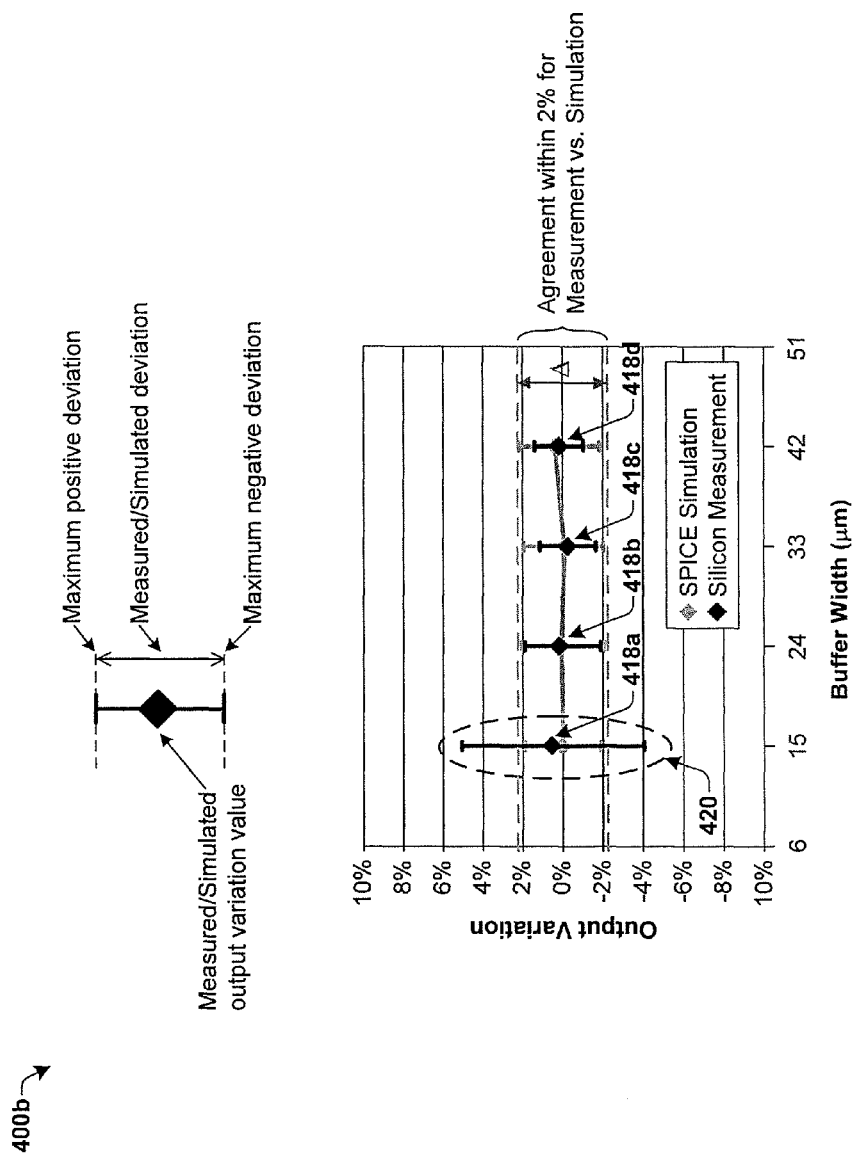
FIG. 4b illustrates a graph of current measurement of some embodiments of a semiconductor device array.

FIG. 4b illustrates a graph 400b of current measurement of some embodiments of the semiconductor device array 400a. As the buffer zone width (BW) of device array 400a is varied by adding rings of dummy cells 408, cell current values are measured for each of the plurality of edge cells 414 for each buffer zone width (BW). For instance, a first data point location 418a corresponds to a current measurement of semiconductor device array 400a with a buffer zone width (BW) of approximately 15 μm (i.e., 5 rings of dummy cells 408 wherein each dummy cell 408 has a width of approximately 3 μm), a second data point location 418b corresponds to a current measurement of semiconductor device array 400a with a buffer zone width (BW) of approximately 24 μm (i.e., 8 rings of dummy cells 408 wherein each dummy cell 408 has a width of approximately 3 μm), and so on for a third data point location 418c (i.e., 11 rings of dummy cells 408), and a fourth data point location 418d (i.e., 14 rings of dummy cells 408). Measured current values for each of the plurality of edge cells 414 are averaged and compared to a current measurement of the reference cell 416 to define a measured output variation value for the plurality of edge cells 414 relative to the reference cell 416 for a fixed buffer zone width (BW). A measured deviation from the measured output variation value comprises a maximum deviation of a cell current value within a respective edge cell 414 from the average value (i.e., the measured deviation shows a maximum positive deviation and a maximum negative deviation of a respective edge cell from the measured output variation value). The measured deviation provides information about a distribution of current values within the plurality of edge cells 414 along the edge of the current unit array 404, and thus their pattern uniformity. The results of a simulated output variation value obtained from a SPICE simulation of semiconductor device array 400a are also plotted in the background for comparison, wherein it will be appreciated to one of ordinary skill in the art that SPICE is one example of an industry-standard tool for circuit simulation and analysis. A simulated deviation from the simulated output variation value provides information about an expected distribution of current values in the edge cells along an edge of the current unit array 404. In some embodiments, the simulated deviation is obtained through Monte-Carlo methods which model a variation of one or more parameters which impact the current measurement within a respective edge cell 414, and provides an expected maximum variation from the simulated output variation value.

The measured output variation value and the simulated output variation value show agreement within 2% for buffer zone widths larger than approximately 15 μm. The measured deviation and the simulated deviation also show less than 2% difference for buffer zone widths larger than approximately 15 μm. However, for narrow buffer zone widths (i.e., 15 μm and below, as shown at the first data point location 418a) the measured deviation and the simulated deviation differ by greater than 2% (420). As a result, in some embodiments, a buffer zone width of greater than approximately 15 μm yields device uniformity comprising less than approximately 2% output variation between unit cells 402 within semiconductor device array 400a.

Figure 5:
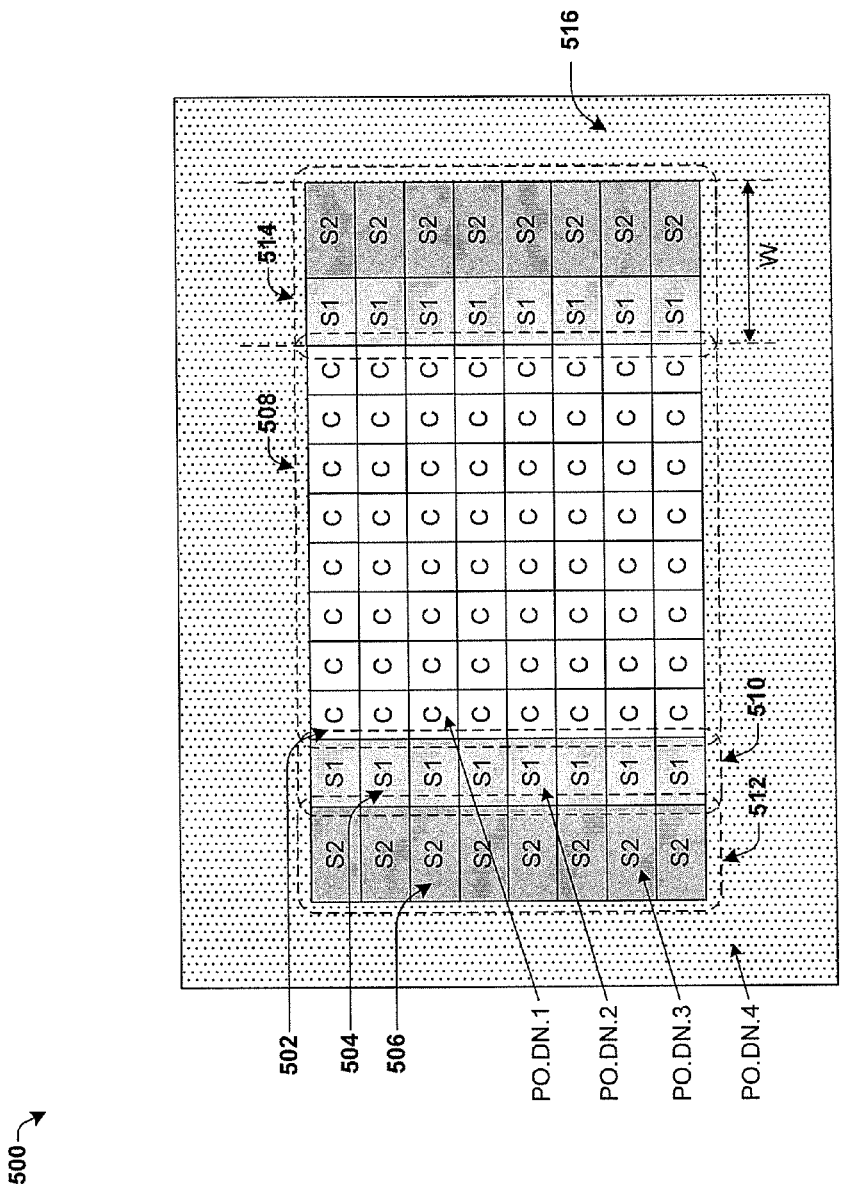
FIG. 5 illustrates some embodiments of a semiconductor device array with multi-step density gradient edge cells.

FIG. 5 illustrates some embodiments of a semiconductor device array 500 with multi-step density gradient smoothing edge cells, comprising three types of cells: a unit cell (C) 502, a first density gradient cell (S1) 504, and a second density gradient cell (S2) 506, each of which comprise one or more MOS devices. A plurality of unit cells 502 are arranged in an array 508. A plurality of first density gradient cells 504 form first linear edge sub-arrays 510 that abut the array 508 on two sides. A first linear edge sub-array 510 comprises a plurality of first density gradient cells 504 arranged in a line or multiple lines which abut one another, as well as one edge of the array 508, wherein a line comprises a plurality of first density gradient cells 504 abutting one another to form a shape with a single width equal to the width of a single first density gradient cell 504, and a length equal to a product of a number of first density gradient cells 504 within the line and the length of an individual first density gradient cell 504. A plurality of second density gradient cells 506 form second linear edge sub-arrays 512 that abut the first linear edge sub-arrays 510 along one edge. The abutting first linear edge sub-array 510 and second linear edge sub-array 512 combine to form multi-step density gradient edge cells 514 with an edge cell region width (W) on two sides of the array 508. The combined array 508 and multi-step density gradient edge cells 514 are surrounded by background circuitry 516.

A respective unit cell (C) 502, a respective first density gradient cell (S1) 504, and a respective second density gradient cell (S2) 506 are not identical. Both the unit cell 502 and array 508 have a first gate material density (PO.DN.1). Both the first density gradient cell 504 and first linear edge sub-array 510 have a second gate material density (PO.DN.2) which is less than the first gate material density (PO.DN.1). Both the second density gradient cells 506 and second linear edge sub-array 512 have a third gate material density (PO.DN.3) which is less than the second gate material density (PO.DN.2), and approaching a fourth gate material density (PO.DN.4) of the background circuitry 516.

In the non-limiting example of the semiconductor device array 500 with multi-step density gradient smoothing edge cells the first gate material density (PO.DN.1) is in the range of approximately 60%-70%, the second gate material density (PO.DN.2) is in the range of approximately 50%-60%, the third gate material density (PO.DN.3) is in the range of approximately 40%-50%, and the fourth gate material density (PO.DN.4) is in the range of approximately 20%-30%. The resulting edge cell region width (W) in the range of approximately 6 μm~12 μm, which is less than the existing buffer zone width of approximately 20 μm~25 μm, while still achieving the desired device uniformity of less than approximately 2% output variation between cells.

Figure 6:
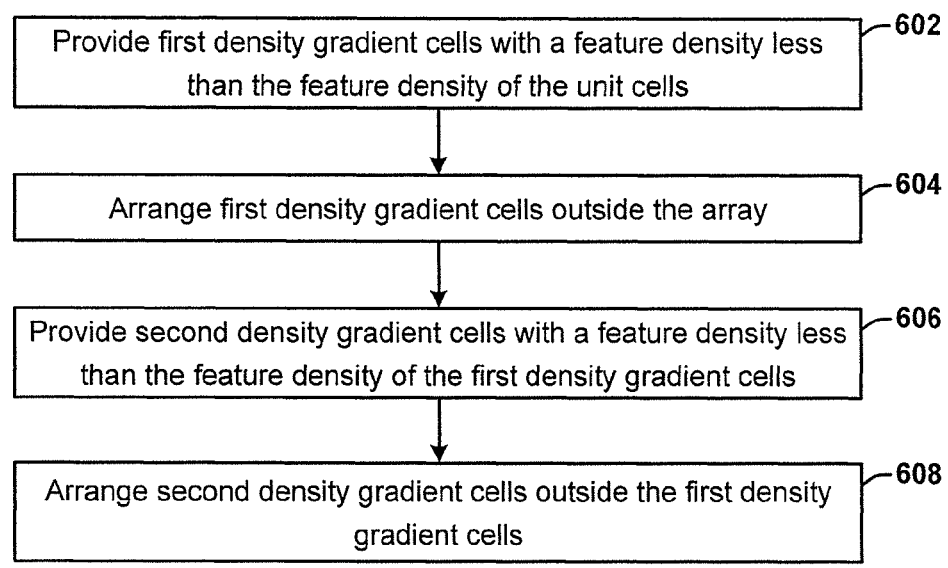
FIG. 6 illustrates a flow diagram of some embodiments of a method to create a multi-step density gradient smoothing layout.

FIG. 6 illustrates a flow diagram of some embodiments of a method 600 to create a multi-step density gradient smoothing layout. While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 602 a plurality of first density gradient cells are provided, wherein a respective first density gradient cell comprises a feature density that is less than the feature density of a respective unit cell. In some embodiments, the unit cell comprises a Random Access Memory (RAM) memory unit cell further comprising Static RAM (SRAM), Dynamic RAM (DRAM), Thyristor RAM (TRAM), ZERO-CAPACITOR RAM (ZRAM), Twin Transistor RAM (TTRAM), etc. In some embodiments, the unit cell comprises a Read Only Memory (ROM) memory unit cell further comprising programmable ROM (PROM), erasable programmable ROM (EPROM), Mask ROM (MROM), etc. In some embodiments, the unit cell comprises a Non-volatile RAM (NVRAM) unit cell.

At step 604 the plurality of first density gradient cells are arranged into a first edge sub-array such that the overall first edge sub-array feature density is approximately the same as the feature density of the first density gradient cell. In some embodiments, the first edge sub-array comprises a linear edge sub-array that borders one or more edges of an array formed from the plurality of unit cells. In some embodiments, the first edge sub-array comprises a perimeter sub-array that surrounds the array, wherein the array has a feature density that is approximately the same as the feature density of the unit cell.

At step 606 a plurality of second density gradient cells are provided, wherein a respective second density gradient cell comprises a feature density that is less than the feature density of the first density gradient cell. The second density gradient cell comprises approximately a same size as the first density gradient cell.

At step 608 the plurality of second density gradient cells are arranged into a second edge sub-array such that the overall second edge sub-array feature density is approximately the same as the feature density of the second density gradient cell. In some embodiments, the second edge sub-array comprises a linear edge sub-array that borders one or more edges of the first edge sub-array. In some embodiments, the second edge sub-array comprises a perimeter sub-array that surrounds the first edge sub-array. The second edge sub-array further comprises a feature density that is poly density (PO.DN.3) which is approaching a poly density (PO.DN.4) surrounding background circuitry.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, various embodiments of the present disclosure relate to a device and method to minimize the area overhead associated with a transition between a semiconductor device array and background circuitry. A multi-step density gradient smoothing layout style is proposed in which a plurality of unit cells are arranged into an array with a feature density. One or more edges of the array is bordered by a first edge sub-array which has a feature density that is less than the feature density of the array. The first edge sub-array is bordered by a second edge sub-array which has a feature density that is less than the feature density of the first edge sub-array, and is close to that of the background circuitry. In some embodiments, the multi-step density gradient smoothing layout style results in a buffer zone width that is less than that of an existing buffer zone, and can achieve the desired device uniformity, and thus results in less wasted chip area and cost savings.

In some embodiments the present disclosure relates to a method of multi-step density gradient smoothing for a semiconductor device array, comprising arranging a plurality of unit cells into an array, wherein a respective unit cell has a feature density. The method of multi-step density gradient smoothing further comprises arranging a plurality of first density gradient cells into a first edge sub-array outside at least part of a perimeter of the array, wherein a respective first density gradient cell has a feature density that is less than the feature density of the unit cell. The method of multi-step density gradient smoothing further comprises arranging a plurality of second density gradient cells into a second edge sub-array outside at least part of a perimeter of the first edge sub-array, wherein a respective second density gradient cell has a feature density that is less than the feature density of the first density gradient cell.

In some embodiments the present disclosure relates to a semiconductor device arrangement comprising an array comprised of a plurality of unit cells, wherein a respective unit cell has a feature density. The semiconductor device arrangement further comprises a first edge sub-array comprised of a plurality of first density gradient cells that form a boundary outside at least part of a perimeter of the array, wherein a respective first density gradient cell has a feature density that is less than the feature density of the unit cell. The semiconductor device arrangement further comprises a second edge sub-array comprised of a plurality of second density gradient cells that form a boundary outside at least part of a perimeter of the first edge sub-array, wherein a respective second density gradient cell has a feature density that is less than the feature density of the first density gradient cell.

In some embodiments the present disclosure relates to a semiconductor memory device arrangement comprising an array comprised of a plurality of memory unit cells, wherein a respective memory unit cell has a first feature density that comprises a total oxide area divided by a total layout area for the array, or a total gate material area divided by a total layout area for the array, wherein the first feature density indicates pattern uniformity within the array. The semiconductor memory device arrangement further comprises a first edge sub-array comprised of a plurality of first density gradient cells that form a boundary outside at least part of a perimeter of the array, wherein a respective first density gradient cell has a second feature density that is less than the first feature density. The semiconductor memory device arrangement further comprises a second edge sub-array comprised of a plurality of second density gradient cells that form a boundary outside at least part of a perimeter of the first edge sub-array, wherein a respective second density gradient cell has a third feature density that is less than the second feature density of the first density gradient cell.

What is claimed is:

1. A method of multi-step density gradient smoothing for a semiconductor device array comprising:
    arranging a plurality of unit cells into an array, wherein a respective unit cell has a feature density;
    arranging a plurality of first density gradient cells into a first edge sub-array outside at least part of a perimeter of the array, wherein a respective first density gradient cell has a feature density that is less than the feature density of the unit cell; and
    arranging a plurality of second density gradient cells into a second edge sub-array outside at least part of a perimeter of the first edge sub-array, wherein a respective second density gradient cell has a feature density that is less than the feature density of the first density gradient cell.

2. The method of claim 1, comprising arranging background circuitry outside at least part of a perimeter of the second edge sub-array, wherein the background circuitry has a feature density that is less than the feature density of the second density gradient cell.

3. The method of claim 2, comprising constructing the second density gradient cell with a feature density that is an average of the feature density of the first density gradient cell and the feature density of the background circuitry.

4. The method of claim 2, comprising constructing the second edge sub-array with a feature density that is an average of the feature density of the first edge sub-array and the feature density of the background circuitry.

5. The method of claim 1, comprising constructing the first density gradient cell with a feature density that is an average of the feature density of the unit cell and the feature density of the second density gradient cell.

6. The method of claim 1, comprising constructing the first edge sub-array with a feature density that is an average of the feature density of the array and the feature density of the second edge sub-array.

7. The method of claim 1, comprising defining the feature density as a total oxide area divided by a total layout area of the semiconductor device array.

8. The method of claim 1, comprising defining the feature density as a total gate material area divided by a total layout area of the semiconductor device array.

9. A semiconductor device arrangement, comprising:
an array comprised of a plurality of unit cells, wherein a respective unit cell has a feature density;
a first edge sub-array comprised of a plurality of first density gradient cells that form a boundary outside at least part of a perimeter of the array, wherein a respective first density gradient cell has a feature density that is less than the feature density of the unit cell; and
a second edge sub-array comprised of a plurality of second density gradient cells that form a boundary outside at least part of a perimeter of the first edge sub-array, wherein a respective second density gradient cell has a feature density that is less than the feature density of the first density gradient cell.

10. The semiconductor device arrangement of claim 9, comprising background circuitry which has a feature density that is less than the feature density of the second density gradient cell.

11. The semiconductor device arrangement of claim 10, wherein the second edge sub-array abuts an edge of the first edge sub-array.

12. The semiconductor device arrangement of claim 11, wherein the second density gradient cell has a feature density that is an average of the feature density of the first density gradient cell and the feature density of the background circuitry.

13. The semiconductor device arrangement of claim 11, wherein the second edge sub-array has a feature density that is an average of the feature density of the first edge sub-array and the feature density of the background circuitry.

14. The semiconductor device arrangement of claim 9, wherein the first edge sub-array abuts an edge of the array.

15. The semiconductor device arrangement of claim 14, wherein the first density gradient cell has a feature density that is an average of the feature density of the unit cell and the feature density of the second density gradient cell.

16. The semiconductor device arrangement of claim 14, wherein the first edge sub-array has a feature density that is an average of the feature density of the array and the feature density of the second edge sub-array.

17. The semiconductor device arrangement of claim 9, wherein the unit cell comprises a memory unit cell.

18. The semiconductor device arrangement of claim 9, wherein the first edge sub-array and the second edge sub-array form linear edge sub-arrays along one or more borders of the array.

19. The semiconductor device arrangement of claim 9, wherein:
the first edge sub-array surrounds the perimeter of the array; and
the second edge sub-array surrounds a perimeter of the first edge sub-array.

20. A semiconductor memory device arrangement, comprising:
an array comprised of a plurality of memory unit cells, wherein a respective memory unit cell has a first feature density that comprises a total oxide area divided by a total layout area for the array, or a total gate material area divided by a total layout area for the array, wherein the first feature density indicates pattern uniformity within the array;
a first edge sub-array comprised of a plurality of first density gradient cells that form a boundary outside at least part of a perimeter of the array, wherein a respective first density gradient cell has a second feature density that is less than the first feature density; and
a second edge sub-array comprised of a plurality of second density gradient cells that form a boundary outside at least part of a perimeter of the first edge sub-array, wherein a respective second density gradient cell has a third feature density that is less than the second feature density of the first density gradient cell.

* * * * *